United States Patent
Ano et al.

(10) Patent No.: US 8,310,069 B2
(45) Date of Patent: Nov. 13, 2012

(54) SEMICONDUCTOR PACKAGE HAVING MARKING LAYER

(75) Inventors: Kazuaki Ano, Hiji-machi (JP); Wen Yu Lee, Taipei (TW)

(73) Assignee: Texas Instruements Incorporated, Dallas, TX (US)

( * ) Notice: Subject to any disclaimer, the term of this patent is extended or adjusted under 35 U.S.C. 154(b) by 978 days.

(21) Appl. No.: 12/211,274

(22) Filed: Sep. 16, 2008

(65) Prior Publication Data

US 2009/0091029 A1    Apr. 9, 2009

Related U.S. Application Data

(60) Provisional application No. 60/977,727, filed on Oct. 5, 2007, provisional application No. 60/977,731, filed on Oct. 5, 2007.

(51) Int. Cl.
*H01L 23/544* (2006.01)
*H01L 21/56* (2006.01)

(52) U.S. Cl. ........ 257/797; 257/678; 257/690; 257/701; 257/702; 257/729; 257/730; 257/787; 257/790; 257/792; 257/793; 257/798; 257/E23.116; 257/E23.119; 257/E23.126; 438/401; 438/975

(58) Field of Classification Search .......... 257/678, 257/690, 701, 702, 729, 730, 787, 790, 792, 257/793, 798, E23.116, E23.119, E23.126, 257/797; 438/401, 975

See application file for complete search history.

(56) References Cited

U.S. PATENT DOCUMENTS

| 6,420,790 | B1 * | 7/2002 | Koizumi | 257/787 |
| 6,680,220 | B2 * | 1/2004 | Minamio et al. | 438/110 |
| 7,276,785 | B2 * | 10/2007 | Bauer et al. | 257/686 |
| 2002/0006501 | A1 * | 1/2002 | Grigg et al. | 428/195 |
| 2002/0168832 | A1 * | 11/2002 | Peterson | 438/401 |
| 2004/0012099 | A1 * | 1/2004 | Nakayama | 257/787 |
| 2004/0170925 | A1 * | 9/2004 | Roach et al. | 430/281.1 |
| 2005/0067676 | A1 * | 3/2005 | Mahadevan et al. | 257/659 |
| 2005/0266602 | A1 | 12/2005 | Hawthorne | |
| 2006/0051689 | A1 * | 3/2006 | Suzuki et al. | 430/66 |
| 2008/0101034 | A1 | 5/2008 | Loon | |
| 2008/0179761 | A1 | 7/2008 | Ano | |

FOREIGN PATENT DOCUMENTS

| JP | 05166949 A | 7/1993 |
| WO | 03043504 A1 | 9/2003 |

* cited by examiner

*Primary Examiner* — Peniel M Gumedzoe
(74) *Attorney, Agent, or Firm* — Steven A. Shaw; W. James Brady; Frederick J. Telecky, Jr.

(57) ABSTRACT

The symbolization of a semiconductor device (100) is incorporated in a thin sheet (130) attached to the top of the device, facing outwardly with its bare surface. The material of the sheet (about 1 to 10 μm thick) includes regions of a first optical reflectivity and a first color, and regions (133) of a second optical reflectivity and a second color, which differ from, and contrast with, the first reflectivity and color. Preferred choices for the sheet material include the compound o-cresol novolac epoxy and the compound bisphenol-A, more preferably with the chemical imidazole added to the film material. A preferred embodiment of the invention is a packaged device with a semiconductor chip a (101) connected to a substrate (102); the connection is achieved by bonding wires (111) forming an arch with a top 111a. The chip, the wire arches, and the substrate are embedded in an encapsulation material (120), which borders on the attached top sheet so that the arch tops touch the border (131).

11 Claims, 4 Drawing Sheets

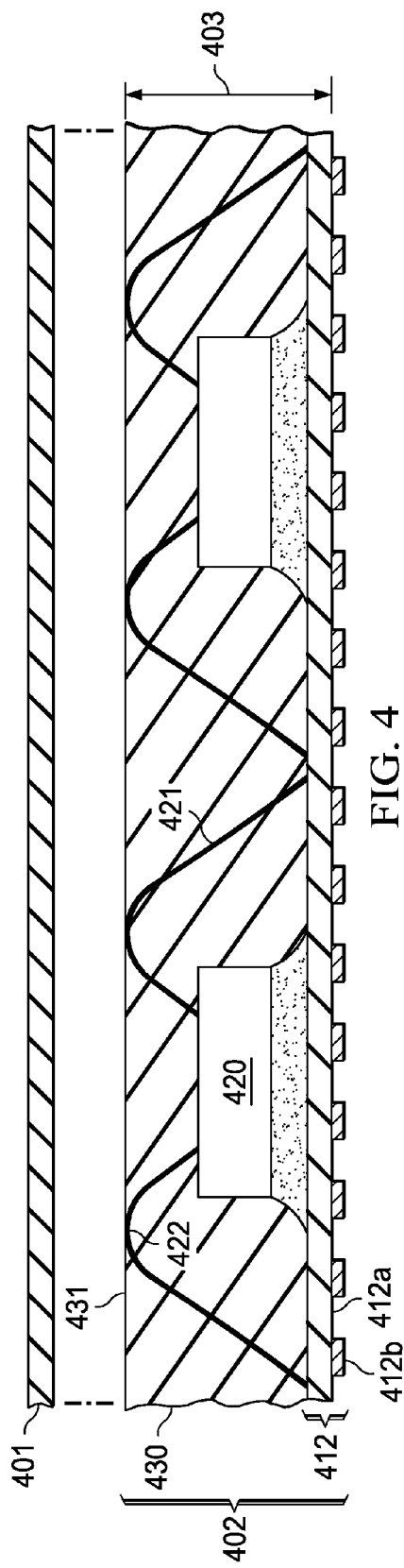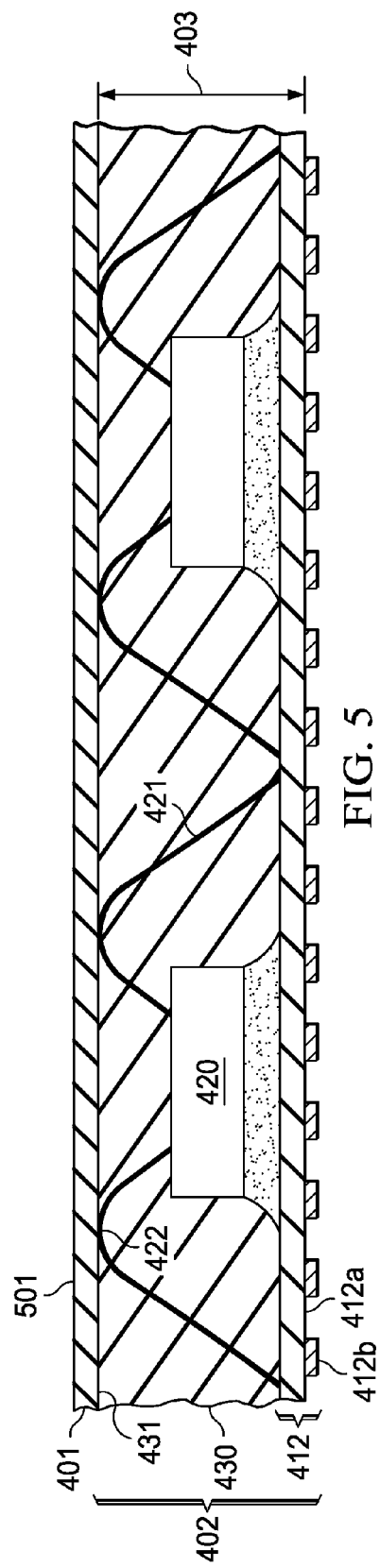

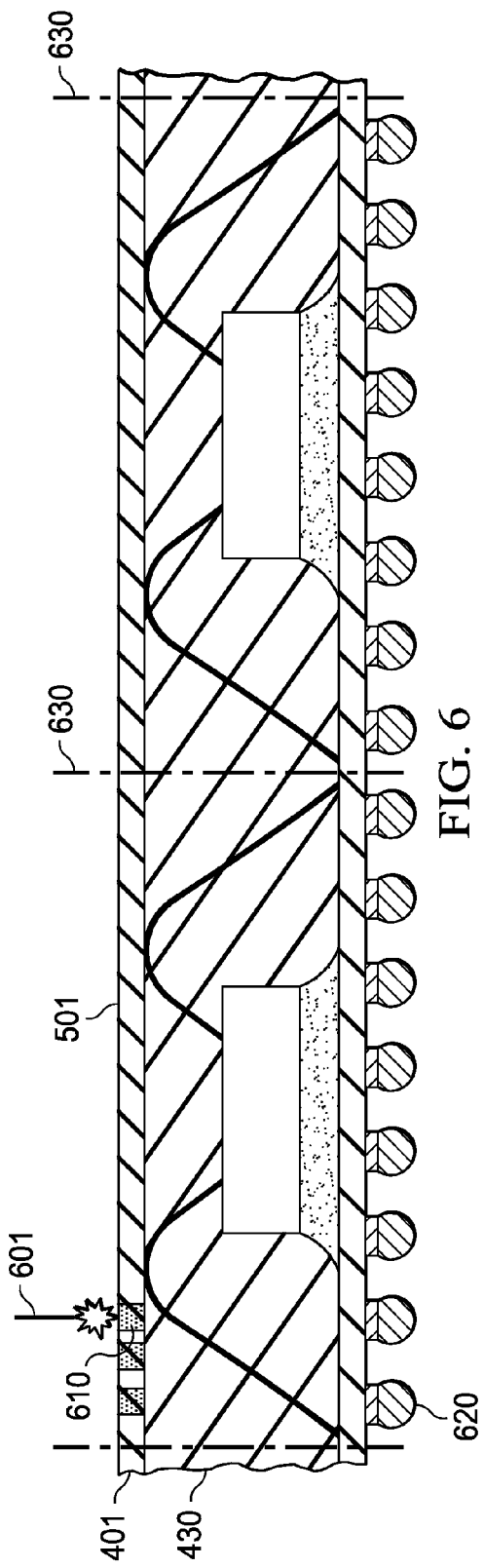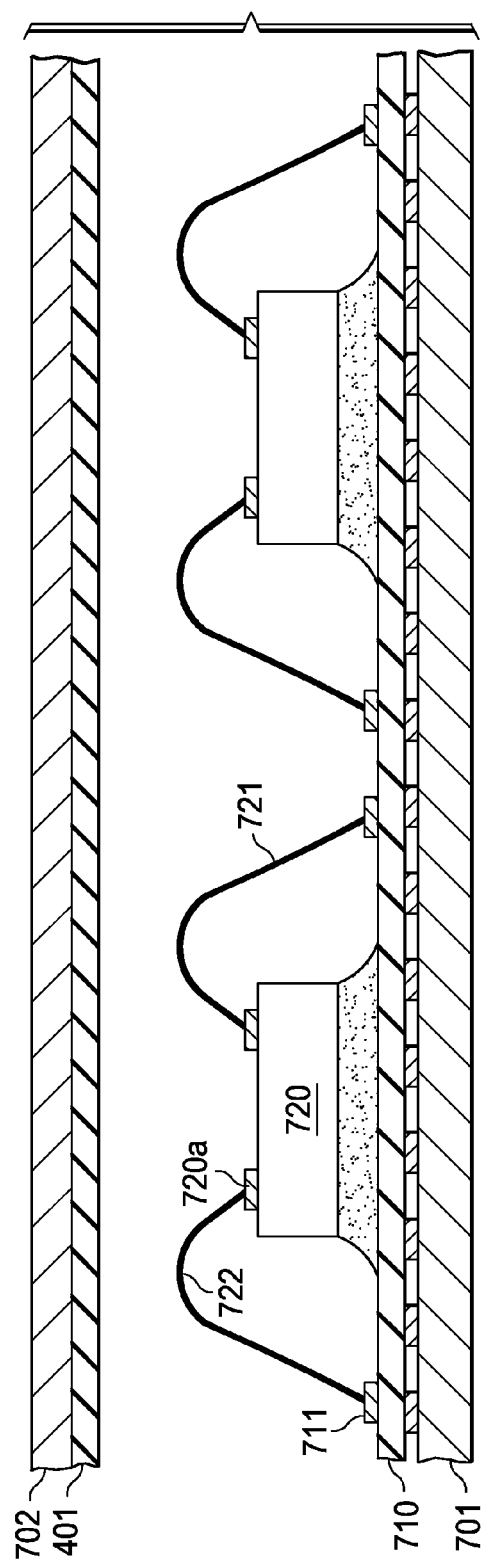

SEMICONDUCTOR PACKAGE HAVING MARKING LAYER

RELATED APPLICATIONS

This application claims the benefit of provisional application Ser. Nos. 60/977,727, and 60/977,731, both filed on Oct. 5, 2007.

FIELD OF THE INVENTION

The present invention is related in general to the field of semiconductor devices and processes, and more specifically to the structure and fabrication method of packages with an attached additional sheet selected for marking with pulsed and focused high energy beams.

DESCRIPTION OF THE RELATED ART

In the process flow of packaging semiconductor chips into complete devices, typically the last step is the symbolization of the device. This step records the information the user needs to know for proper identification and usage of the device. Examples include device type and model, manufacturer, key performance characteristics, and dates. Typical symbolization elements include numbers, alphabetic letters, trademark symbols, punctuations, arrows, etc. Among the favorite symbolization techniques are stamping with ink for letter sizes as small as 0.8 mm height, and scribing with lasers for letter sizes as small as 0.56 mm height.

In the inking technique, it is the color difference between the ink and the package top surface, which makes the symbolization legible. The color-contrasting ink is deposited on the top package surface, for instance white ink on black epoxy-molded packages. The deposited ink forms heaps or piles on the package surface, deviating from the flatness of the package surface. Among the limitations for reducing the letter sizes are especially the fuzziness at the ink borders and the risk of smearing of the ink.

In the laser scribing technique, it is the reflection difference for visible light, which makes the symbolization legible. Laser scribing is especially favored for packages made by plastic compounds, which are commonly fabricated by the transfer molding technique. In the molding technology, the compound is selected to obtain a shiny surface after polymerization so that the surface has good reflection of visible light. The laser beam digs a groove into the encapsulation resin, which renders the affected zones with a poor light reflection. The depth of the grooves is typically about 30 to 50 µm. A principal limitation for reducing the letter sizes is the pile-up of the debris along the rims of the laser grooves.

Both the inking technique and the laser scribing technique are employed for the symbolization of semiconductor devices, which have the semiconductor chip electrically connected to the substrate, leadframe, or other parts inside the package either by the wire bonding technique, which typically results in wire spans arching with a top, or by the flip-chip attachment methodology.

SUMMARY OF THE INVENTION

Applicant recognized that the ongoing market trend towards smaller and thinner semiconductor components is now demanding packages with a compound thickness of 30 µm or less between the package surface and the wire arch tops. Whenever the bonding wire tops come in close proximity to the package top surface, there is a high risk that the scribing laser beam digs the grooves all the way through the thin encapsulation material to expose the bond wire arch tops. When this damage happens, the device becomes useless. Consequently, the conventional method of incorporating the device symbolization for packaged wire-bonded chips into the surface of the package compound may result in unacceptable failure rates for ultra-thin devices.

Applicant solved the problem when he discovered a methodology to uncouple the symbolization from the bulk of the package compound. Instead, the symbolization is incorporated in a thin sheet attached to the top of the bulk compound and faced outwardly with its bare surface. The material of the sheet includes regions of a first optical reflectivity and a first color, and contiguous regions of a second optical reflectivity and a second color, which differ from, and contrast with, the first reflectivity and color. The regions of the second reflectivity constitute the letters, numbers, punctuations, or trademarks of the device symbolization.

Applicant discovered that preferred choices for the sheet material include the compound o-cresol novolac epoxy and the compound bisphenol-A, more preferably with the chemical imidazole added to the film material. Applicant further found that that preferred sheet thickness is between about 1 and 10 µm.

Preferred embodiments of the invention include packaged devices with a semiconductor chip connected to a substrate. In one embodiment, the connection is achieved by bonding wires forming an arch with a top. The chip, the wire arches, and the substrate are embedded in an encapsulation material, which borders on the attached top sheet so that the arch tops touch the border.

In another embodiment, the connection is achieved by flipping the chip and attaching the metallic studs on the chip surface with the integrated circuits to the substrate. The chip surface without the integrated circuits faces outwardly and includes the attached sheet with the regions of contrasting optical reflectivity and color for the device symbolization.

Another embodiment of the invention is a method for fabricating an apparatus. A sheet of a material with a first optical reflectivity is placed on the flat surface of a semiconductor device; the sheet thus contacts the device and faces with its bare surface away from the device. The temperature of the device and the sheet is then elevated for a period of time to solidify the contact between the sheet and the device; exemplary temperatures are between about 170 and 250° C. and exemplary times between about 30 and 300 s. A pulsed beam of energy, such as a laser, is then focused on a spot of the bare sheet surface; the pulsed energy is absorbed by the material, thereby altering the first reflectivity of the spot to a second reflectivity different from, and contrasting with the first reflectivity. The steps of focusing energy pulses is repeated on adjacent spots to create regions of second reflectivity, which constitute the symbolization of the apparatus.

Another embodiment of the invention is a method for fabricating a semiconductor device. A plurality of semiconductor chips are connected to a substrate strip by arched bonding wires; the arches reach tops. The strip is placed on the bottom of a mold cavity so that the wire arches are oriented upward from the bottom. A sheet of a material with a first optical reflectivity is placed on the flat lid of the mold so that the sheet faces the cavity. The lid is placed on the cavity to close the cavity. The temperature of the mold and the strip is raised and the mold is filled with an encapsulation compound. Thereby, the chip and the wire arches are embedded in the compound and the sheet is attached to the compound. The mold lid is lifted from the sheet, whereby the bare surface of the attached sheet is exposed. As stated, the sheet has a first optical reflectivity and a color. A pulsed beam of energy is then focused on a spot of the bare sheet surface; the pulsed energy is absorbed by the material, thereby altering the first reflectivity of the spot to a second reflectivity different from, and contrasting with the first reflectivity. The steps of focusing energy pulses is repeated on adjacent spots to create regions of second reflectivity, which constitute the device symbolization. If desired, solder bodies are attached to the substrate strip for connections to external parts, and the substrate strip is singulated into discrete devices with semiconductor chips.

It is a technical advantage of the invention that the thin sheet on the device top surface uses compounds undergoing color and reflection changes instead of evaporating or sputtering after absorbing impinging laser pulses. As a consequence, the package top surface remains flat and free of debris and damage by grooves, which in known technology represent a risk for exposing surface-near wire arches.

It is a technical advantage that the invention maintains the flatness of the device top surface because the symbol-inscribing method of the invention avoids the deposition of ink, which typically heaps ink material on the surface, and the drilling of grooves with pile-up of debris caused by laser marking. As a consequence, the precious thinness of semiconductor packages and suitability for stacking are fully maintained.

It is another technical advantage of the invention that the method of symbolization is applicable for batch processing and chip-scale packages. The device singulation step can thus be performed as the last step before shipping.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 4 to 6 depict steps of the device fabrication according to an embodiment of the invention.

FIG. 4 shows a schematic cross section of a substrate strip including chips connected by arching wire bonds to the substrate and embedded in an encapsulation compound (for example, molding compound) with a flat surface, wherein the tops of the arches border on the package surface. A sheet of a material is provided to be attached to the encapsulation surface.

FIG. 5 is a schematic cross section of the encapsulated substrate strip of FIG. 4 after attaching the sheet to the encapsulation surface, creating a border between the sheet and the encapsulation compound.

FIG. 6 is a schematic cross section of the substrate strip of FIG. 5 after attaching solder bodies to the substrate, illustrating the energy pulses (for example, laser pulses) employed to alter the optical reflectivity and color in spots in the sheet material, resulting in an altered reflectivity and color, contrasting with the un-altered reflectivity and color.

FIGS. 7 and 8 depict steps of the device fabrication according to another embodiment of the invention.

FIG. 7 shows a schematic cross section of a substrate strip including chips connected by arching wire bonds to the substrate, the strip positioned on the bottom of a mold cavity. The mold lid has a sheet attached and is readied to be lowered to close the mold.

FIG. 8 is a schematic cross section of the substrate strip of FIG. 7 after lowering the mold lid together with the sheet; in this example, the sheet touches the arch tops. The mold cavity has been filled with molding compound so that the compound is contiguous with the sheet.

DETAILED DESCRIPTION OF THE PREFERRED EMBODIMENTS

Figure 1:
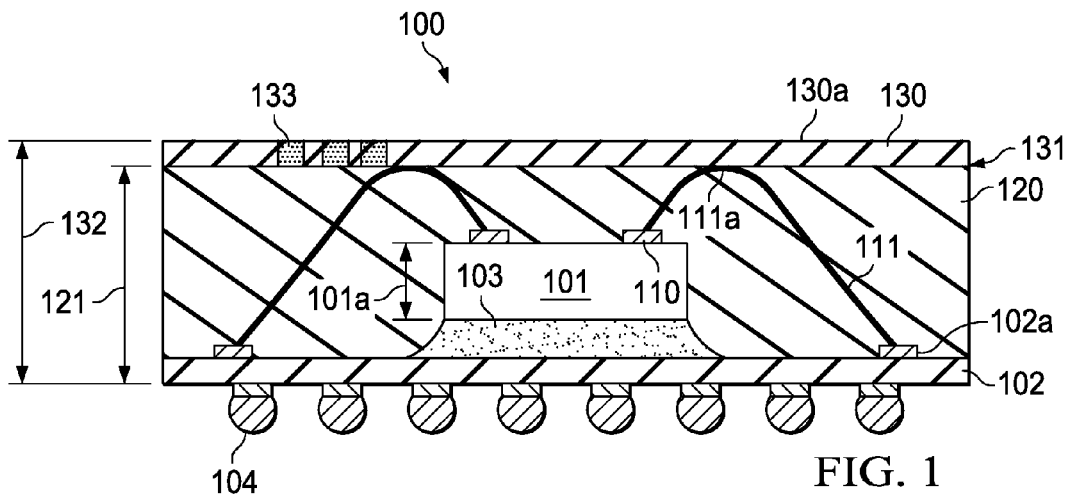
FIG. 1 shows a schematic cross section of a thin device with a semiconductor chip wire-assembled on a substrate and packaged with a flat top sheet for the symbolization composed of embedded regions, which contrast in color and optical reflection relative to the surrounding material after absorbing high intensity energy pulses.

FIG. 1 shows a semiconductor device generally designated 100 as an embodiment of the invention. An assembled semiconductor chip 101 is encapsulated in a polymeric compound 120. On the top surface of compound 120 is a sheet 130, preferably made of a polymeric material (see below), attached to and in contiguous contact with the compound of encapsulation 120. Sheet 130 has a surface 130a, which is bare and substantially flat. As FIG. 1 indicates, the encapsulation compound and sheet 130 share a border 131.

The polymeric material of sheet 130 is selected to provide the sheet with a first optical reflectivity and a first color. When an energy pulse such as the pulse of focused laser light, or another high intensity light source, is shining on a spot 133 of sheet 130, the energy is absorbed by the material of the spot, predominantly as thermal energy, elevating the temperature of the spot. The polymeric material alters its chemical configuration locally so that the modified material has a second optical reflectivity and color different from the first reflectivity and color of the un-altered configuration, creating a visible contrast in reflectivity and color. A major contribution to the change of reflectivity and color is a molecular disturbance resembling burned resin. However, the change of reflectivity and color by absorbing the energy pulse does not substantially modify the flatness of sheet surface 130a; consequently, no grooves are created and no debris is piled up by the absorption of the energy pulses.

When consecutive pulses move laterally, a plurality of spots 133 is formed, which may be lined up as an array. These spots create (second) regions of the second optical reflectivity and color surrounded by the (first) regions of the first reflectivity and color. The second regions preferably configure the letters, numbers, punctuations, trademarks, symbols, etc., which are needed to identify and characterize the product, for example with regard to device type, model number, performance information, and origin and time period of manufacturing.

Suitable materials for sheet 130 include the compound o-cresol novolac epoxy and the compound bisphenol-A. In addition, the chemical molecule imidazole may be added to these compounds. These compounds are commercially available, for instance from Nippon Steel Chemical Company Ltd. in Japan. The preferred thickness range of sheet 130 is between about 1 and 10 µm.

As FIG. 1 shows, semiconductor chip 101 has a thickness 101a (between about 300 and less than 100 µm). The chip is attached to a substrate 102 by a polymeric attach material 103, preferably an epoxy-based or polyimide-based adhesive. Substrate 102 is preferably a thin (for example, about 30 to 70 µm) sheet or tape made of insulating material such as polyimide, and includes conductive traces 102a. Alternatively, substrate 102 may be a leadframe with metallic segments. For connection to external parts, the insulating substrate 102 has pads with solder bodies 104.

Chip 101 has terminals 110 for electrical connection. In FIG. 1, the terminals are connected to the substrate traces 102a by the spans of bonding wires 111, which form arches in order to avoid accidental contact with the edges of the semiconductor chip. The arches include tops 111a.

The arches of wires 111, the chip 101, and the substrate side with the traces 102a are embedded in a polymeric material, which forms an encapsulation 120 of the assembled chip and also provides robustness to the substrate 102. When device 100 is manufactured by a molding technique, the encapsulation material is preferably an epoxy-based molding compound. The height of the encapsulation material together with the substrate thickness reach the thickness 121. The market and product trend is to keep thickness 121 as small as possible. The effort to reduce thickness 121 includes the need to keep chip thickness 101a small and the wire tops 111a low. Thickness 121 together with the thickness of sheet 130 result in device thickness 132. The effort to keep thickness 132 small is best supported when the arch tops 111a are near the border 131, and preferably touch the border 131 as indicated in FIG. 1.

Figure 2:
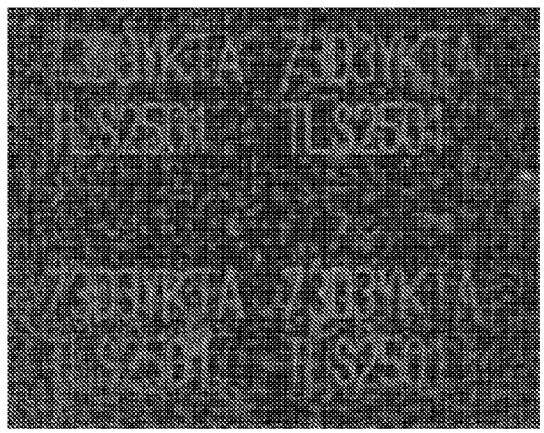
FIG. 2 illustrates a magnified top view of a sheet material on a device, wherein the material includes arrays of embedded spots contrasting in color and optical reflectivity relative to the surrounding material in order to create the device symbolization.

FIG. 2 illustrates an enlarged top view of an exemplary symbolization of numbers and letters. In this example, the polymeric compound of the sheet has a black color and a shiny reflection. The symbols are composed of spots, which have absorbed laser pulses and thus changed their color to an orange hue. A closer examination reveals that the spot have a matte reflection. In this example, the actual height of the letters and numbers is approximately 0.5 mm.

Figure 3:
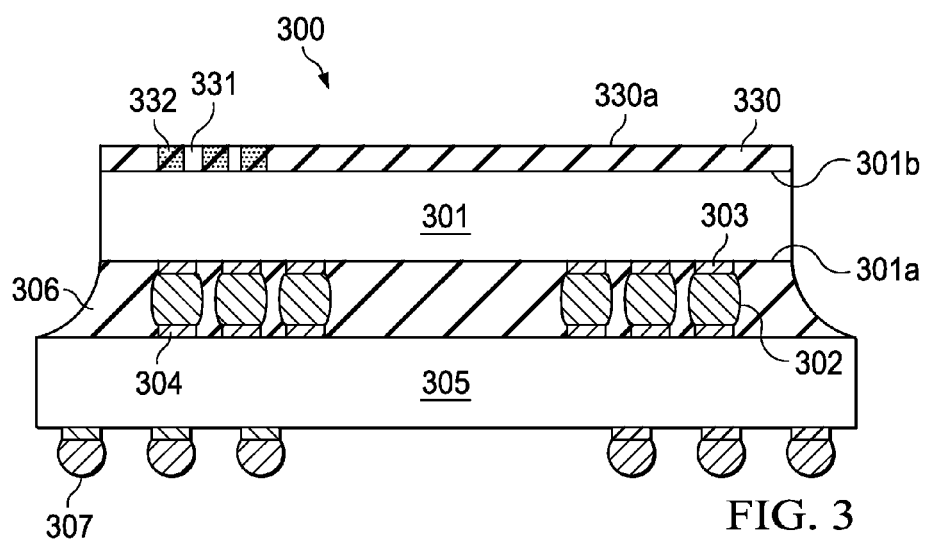
FIG. 3 shows a schematic cross section of a device with the active surface of a semiconductor chip flipped on a substrate, wherein the passive chip surface includes a sheet of a material for the device symbolization composed of embedded spots contrasting in color and optical reflectivity relative to the surrounding material after having absorbed high intensity energy pulses.

FIG. 3 shows another embodiment of the invention for a semiconductor device, generally designated 300, with flip-assembled chip 301. The chip surface 301a, which includes the electrically active components, has terminals 303, which are connected by metal bumps 302 to the respective contact pads 304 of substrate 305. Metal bumps 302 may either be reflow bodies, usually tin-based solder balls, or bumps made of metals or alloys, which do not reflow at semiconductor assembly temperatures. Preferred metals include gold, copper or alloys thereof. The gap between the chip and the substrate and the space between the contact joints is preferably filled with plastic material 306 (so-called underfill compound) in order to mitigate thermomechanical stress on the contact joints. Substrate 305 may have solder balls 307 attached in order to provide attachment to external parts.

As FIG. 3 depicts, the chip surface 301b is remote from the metal bumps and is flat throughout. Attached to flat surface 301b is the sheet 330 of a polymeric compound, which has a chemical configuration to give a color and an optical reflectivity to the compound. Sheet 330 is in contact with surface 301b throughout and has a bare and substantially flat surface 330a free of indents or grooves, and also free of deposits of foreign materials (such as ink or marking substances).

Sheet 330 includes first regions 331 with a first optical reflectivity and color, and second regions 332 with a second optical reflectivity and color. The second reflectivity and color differs from and contrasts with the first reflectivity and color. The second regions are composed of spots, which exhibit the compound of sheet 330 in a locally altered chemical configuration, resulting in the contrast of the spots with the un-altered compound configuration regarding color and optical reflectivity. A major contribution to the color and reflectivity change is a molecular disturbance resembling burned resin. As stated above, the altered compound configuration is preferably caused by a pulse of focused energy, such as focused laser light shining on a spot of region 332 of sheet 330. The energy pulse is absorbed by the material of the spot as transient thermal energy, elevating temporarily the temperature of the spot. Alternatively, a pulse of thermal energy may be used.

FIGS. 4 to 6 depict steps of the device fabrication according to another embodiment of the invention. In FIG. 4, 401 denotes a sheet of a material with a first optical reflectivity and color, and 402 denotes a strip of assembled and packaged semiconductor devices. Preferably, the sheet 401 is between about 1 and 10 µm thick and made of a polymeric compound selected from a group including the compound o-cresol novolac epoxy and the compound bisphenol-A, more preferably including the chemical molecule imidazole. The strip 402 of semiconductor devices includes a substrate strip 412, which in FIG. 4 is shown as tape 412a made of an insulating material (such as polyimide, integral with conductive traces) with metallic contact pads 412b. Alternatively, substrate strip 412 may be a metallic leadframe.

In the preferred embodiment illustrated in FIG. 4, the semiconductor chips 420, mounted on substrate strip 412, are connected to the substrate by bonding wires 421. The wire spans of bonding wires 421 form arches including a top 422. Chips 420 and wires 421 are embedded in encapsulation compound 430, which has a substantially flat surface 431. Preferably, encapsulation compound 430 is an epoxy-based molding compound. Together with the thickness of substrate 412, the encapsulation compound thickness determines the overall thickness 403 of device strip 402. It was stressed above that the market trend favors small thicknesses 403. Consequently, it is preferred to keep the wire arches low and let the arch tops 422 come very close to surface 431 of compound 430. The attachment of sheet 401 on top of surface 431 allows the arches 422 to actually touch surface 431—a technical advantage of the invention.

FIG. 5 illustrates the process step of placing sheet 401 on the flat surface 431 of the encapsulation compound 430. Sheet 401 is contacting the compound surface 431, while the bare surface of the sheet faces away from compound 430 and becomes the new device surface 501. Subsequent to the step of attaching sheet 401 onto the assembled strip 402, the temperature of the combined device is elevated for a period of time to solidify the contact between the sheet and the assembled strip. Preferably, the elevated temperature is in the temperature range needed for completely polymerizing the encapsulation compound 430, which may be only partially polymerized at the beginning of the process step of FIG. 5. A suitable temperature range is between 140 and 180° C.; a suitable period of time is between 10 and 60 s.

FIG. 6 depicts the process step of focusing a pulsed beam 601 of energy on a spot 610 of the bare sheet surface 501. A preferred energy beam is a 1 to 3 W YAG laser (1024 nm); an alternative energy source is ultraviolet light. The pulsed energy is absorbed by the sheet material; it changes its chemical configuration, similar to heat-treated or burnt resin. There may also be a slight volumetric expansion included in this change. The original, first reflectivity and color of the spot are changed to a second reflectivity and color, which are different from the first reflectivity and color, causing a visible contrast.

As FIG. 6 indicates, the process step of focusing a pulsed beam of energy is repeated on adjacent spots 610 of sheet material in order to create second regions of the second reflectivity and color. These second regions may be arrayed so that they constitute symbols like letters and numbers, conveying information about the device, such as device type, model number, performance information, and origin and time of manufacturing. All this information is incorporated in the marking sheet 401.

Further indicated in FIG. 6 is the process step of attaching solder bodies 620 to the substrate strip; they serve the connection to external parts. As the final step, the completed device strip may be singulated into discrete devices containing semiconductor strips. A preferred method of separation is the sawing along cutting lines 630.

Figure 8:
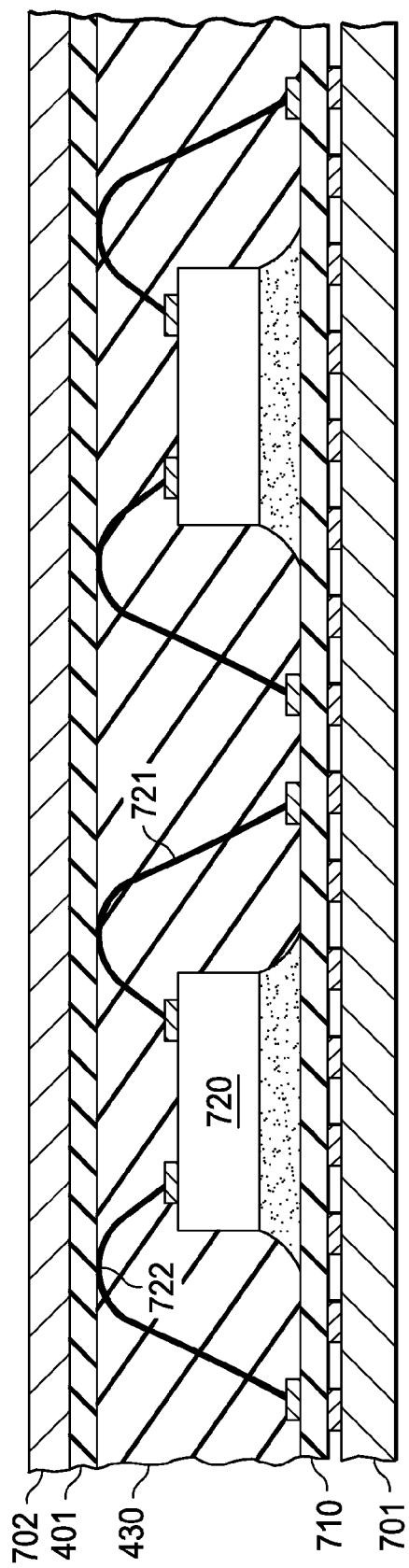

FIGS. 7 and 8 depict steps of the device fabrication according to another embodiment of the invention. In FIG. 7, portions of a mold cavity are shown by depicting the steel bottom mold part 701 and the steel mold lid 702. On the bottom part of the mold cavity has been placed a substrate strip 710 with metallic pads 711, onto which a plurality of semiconductor chips 720 with metallic terminals 720a has been assembled. The chip terminals 720a have been connected to the substrate pads 711 by arching bonding wires 721 from the terminals to the pads, whereby the arches reach tops 722. When the strip 710 has been placed on the bottom 701 of the mold cavity, the wire arches 722 are oriented upwards from the cavity bottom.

Further illustrated in FIG. 7 is the process step of placing a sheet designated 401 flat on the mold lid. Preferably, the sheet 401 is between about 1 and 10 µm thick and made of a polymeric compound selected from a group including the compound o-cresol novolac epoxy and the compound bisphenol-A, more preferably including the chemical molecule imidazole. The compound of sheet 401 is referred to as the first polymer compound in order to distinguish it from the second polymeric compound used to fill the mold cavity; see below. The first compound has a (first) optical reflectivity and color. When placed on the lid 702, sheet 401 faces the mold cavity.

In the next process step, illustrated in FIG. 8, the mold lid 702 with the sheet 401 is lowered onto the mold cavity, preferably until sheet 401 touches the arch tops 722 of the assembled chips 720. Next, the mold cavity is filled with a second polymeric compound 430 so that the chips 720 and the wire arches 721,722 are embedded in the second compound and the second compound 430 contacts the sheet 401. Preferably, encapsulation compound 430 is an epoxy-based molding compound, which requires a molding temperature of about 175° C. for suitable viscosity.

While the mold cools down and the polymerization process of the encapsulation compound 430 begins, the contact between sheet 401 and compound 430 is solidified. Sheet 401 is thus attached to compound 430; the arch tops 722 of the wires may touch the border between sheet 401 and compound 430. Thereafter, mold lid 702 can be lifted from the sheet, exposing the bare surface of the sheet.

The next process step is analogous to the step shown in FIG. 6. A pulsed beam of energy is focused on a spot of the bare sheet surface. A preferred energy beam is a 1 to 3 W YAG laser (1024 nm); an alternative energy source is ultraviolet light. The pulsed energy is absorbed by the sheet material; it changes its chemical configuration, similar to heat-treated or burnt resin. There may also be a slight volumetric expansion included in this change. The original, first reflectivity and color of the spot are changed to a second reflectivity and color, which are different from the first reflectivity and color, causing a visible contrast.

The process step of focusing a pulsed beam of energy is repeated on adjacent spots of sheet material in order to create second regions of the second reflectivity and color. These second regions may be arrayed so that they constitute symbols like letters and numbers, conveying information about the device, such as device type, model number, performance information, and origin and time of manufacturing.

Solder bodies may be attached to the substrate strip; they serve the connection to external parts. Alternatively, the contact pads of the substrate may be used for pressure contacts to external parts. As the final step, the completed device strip may be singulated, for instance by sawing, into discrete devices containing semiconductor strips.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the invention applies also to devices, wherein a laser pulse may cause a bulging of the marking sheet with a bulge height of the same order as the sheet thickness, and also to cases with a bulge width about 6 to 8 times the bulge height. In either case, the size of a symbol achievable with the invention may be much smaller (<0.5 mm) than achievable by conventional technology (cutting grooves of about 30 to 50 µm depth).

It is therefore intended that the appended claims encompass any such modifications or embodiments.

We claim:

1. An apparatus comprising:
   a substrate:
   a packaged semiconductor device having a semiconductor chip connected to the substrate by a plurality of bonding wires, the bonding wires having arches including tops;
   a package material, which encapsulates the semiconductor chip, the plurality of bonding wire arches, and a surface of the substrate, and forms a flat surface of the packaged semiconductor device; and
   a polymer sheet attached to the packaged semiconductor device flat surface, the polymer sheet having a bare surface, the polymer sheet including first regions having a first optical reflectivity and second regions having a second optical reflectivity; wherein the second reflectivity differs from and contrasts with the first reflectivity, wherein the second regions have undergone a molecular disturbance without addition or loss of any material from the polymer sheet to create the second regions;
   wherein the tops of the plurality of bonding wire arches touch the packaged semiconductor device flat surface bordering on the attached sheet.

2. The apparatus of claim 1, wherein the semiconductor chip has metallic studs attached to the substrate, wherein the packaged semiconductor device surface opposite the studs is the device flat surface.

3. The apparatus of claim 1 wherein the second regions constitute symbols conveying information about the device.

4. The apparatus of claim 1 wherein the sheet has a thickness between about 1 and 10 µm.

5. The apparatus of claim 1 wherein the sheet is made of a polymeric compound selected from a group including the compound o-cresol novolac epoxy and the compound bisphenol-A.

6. The apparatus of claim 5 wherein the polymeric compound further includes the chemical molecule imidazole.

7. The apparatus of claim 6 wherein the polymeric compound operates to change the first optical reflectivity to the second optical reflectivity after absorbing a pulse of optical or thermal energy.

8. The apparatus of claim 5 wherein the first regions further have a first color and the second regions have a second color, wherein the second color differs from the first color and wherein the polymeric compound further operates to change the first color to the second color after absorbing a pulse of optical or thermal energy.

9. An apparatus comprising:
   a semiconductor device having a flat surface of molding compound;
   a polymer sheet attached to and coextensive with the flat surface;
   a plurality of regions visible on the flat surface which have undergone a molecular disturbance to leave marks without addition or loss of any material from the sheet; and
   a semiconductor chip connected to a substrate with a bonding wire, which is exposed from the molding compound and contacts the polymer sheet.

10. The apparatus of claim 9, in which the plurality of regions have contrasting reflectivity produced by the molecular disturbance.

11. The apparatus of claim 9, in which the plurality of regions have contrasting color produced by the molecular disturbance.

* * * * *